United States Patent
Ho

(10) Patent No.: US 10,811,102 B2
(45) Date of Patent: Oct. 20, 2020

(54) FLASH MEMORY STORAGE APPARATUS AND READING METHOD THEREOF

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 83 days.

(21) Appl. No.: 15/989,213

(22) Filed: May 25, 2018

(65) Prior Publication Data
US 2019/0057747 A1  Feb. 21, 2019

(30) Foreign Application Priority Data

Aug. 15, 2017 (CN) .......................... 2017 1 0695253

(51) Int. Cl.
| | |
|---|---|
| *G11C 16/26* | (2006.01) |
| *G11C 16/08* | (2006.01) |
| *G11C 16/24* | (2006.01) |
| G11C 16/04 | (2006.01) |

(52) U.S. Cl.
CPC .............. *G11C 16/26* (2013.01); *G11C 16/08* (2013.01); *G11C 16/24* (2013.01); *G11C 16/0483* (2013.01)

(58) Field of Classification Search
CPC ......... G11C 16/26; G11C 16/08; G11C 16/24; G11C 16/0483
USPC .................................................. 365/185.25
See application file for complete search history.

(56) References Cited

U.S. PATENT DOCUMENTS

| | | | | |
|---|---|---|---|---|
| 6,028,788 | A * | 2/2000 | Choi ................... | G11C 16/0483 365/185.11 |
| 8,441,853 | B2 | 5/2013 | Li | |
| 8,717,815 | B2 | 5/2014 | Vali et al. | |
| 9,349,462 | B1 * | 5/2016 | Shirota .................. | G11C 16/24 |
| 9,704,587 | B1 * | 7/2017 | Park ..................... | G11C 16/0483 |
| 2010/0054045 | A1 * | 3/2010 | Ho .......................... | G11C 16/24 365/189.05 |

(Continued)

FOREIGN PATENT DOCUMENTS

| | | |
|---|---|---|
| CN | 101071642 | 11/2007 |
| TW | I467576 | 1/2015 |

OTHER PUBLICATIONS

"Office Action of Taiwan Counterpart Application," dated Apr. 20, 2018, p. 1-p. 3.

*Primary Examiner* — Sung Il Cho
(74) *Attorney, Agent, or Firm* — JCIPRNET

(57) ABSTRACT

A flash memory storage apparatus and a reading method thereof are provided. The flash memory storage apparatus includes a memory cell array and a memory control circuit. The memory cell array includes at least one memory cell string coupled between a bit line and a source line. The memory control circuit is coupled to the memory cell array and configured to control a read operation of the memory cell array during the reading period. The reading period includes a pre-charge period and a discharge period. The source line performs a pre-charge operation on the bit line via a signal transmission path during the pre-charge period. The bit line performs a discharge operation on the source line via the same signal transmission path during the discharge period. The signal transmission path includes the memory cell string.

20 Claims, 4 Drawing Sheets

(56) References Cited

U.S. PATENT DOCUMENTS

| | | |
|---|---|---|
| 2011/0194348 A1 | 8/2011 | Mokhlesi et al. |
| 2011/0194350 A1 | 8/2011 | Vali et al. |
| 2012/0081964 A1* | 4/2012 | Li ........................ G11C 11/5642 |
| | | 365/185.17 |
| 2013/0250698 A1* | 9/2013 | Kim ....................... G11C 16/14 |
| | | 365/185.25 |
| 2014/0192584 A1* | 7/2014 | Aritome ................. G11C 5/063 |
| | | 365/72 |
| 2017/0092362 A1* | 3/2017 | Takekida ........... G11C 16/3459 |

* cited by examiner

FLASH MEMORY STORAGE APPARATUS AND READING METHOD THEREOF

CROSS-REFERENCE TO RELATED APPLICATION

This application claims the priority benefit of China application serial no. 201710695253.9, filed on Aug. 15, 2017. The entirety of the above-mentioned patent application is hereby incorporated by reference herein and made a part of this specification.

BACKGROUND OF THE INVENTION

1. Field of the Invention

The invention relates to a memory storage apparatus and a reading method thereof and particularly relates to a flash memory storage apparatus and a reading method thereof.

2. Description of Related Art

With the evolution of electronic science and technologies, electronic devices have become indispensable in our daily lives. Flash memory has become an important information storage medium because of providing persistent and massive information storage functions.

Flash memory apparatus includes a plurality of flash memory cell strings. With an increase in demand for information storage, the number of flash memory cells included in the flash memory cell strings also increases. The state of the flash memory cells in the flash memory cell strings influences an equivalent resistance value in the flash memory cell strings. For example, assuming that the flash memory cells in a single flash memory cell string are all in a programmed state, the programmed flash memory cells have a higher critical voltage value, so the programmed flash memory cells have a higher equivalent resistance value during a sensing period or a reading period. At this time, the flash memory cell string in charge and discharge processes is equivalent to a plurality of serially-connected resistors which serve as a signal transmission path having a high resistance value.

On the other hand, assuming that the flash memory cells in a single flash memory cell string are all in an erased state, the erased flash memory cells have a lower critical voltage value, so the erased flash memory cells are in a state similar to a short-circuit during the reading period. At this time, the flash memory cell string in the charge and discharge processes is equivalent to a signal transmission path having a low resistance value. Therefore, the state of the flash memory cells in the flash memory cell strings influences the equivalent resistance value of the flash memory cell strings and influences the charge and discharge processes during the sensing period or the reading period. This is the so-called back-pattern effect.

Under the influence of the back-pattern effect, the discharge speed amongst a plurality of bit lines may vary because of the difference in the equivalent resistance of the corresponding flash memory cell strings, which further results in a misjudgment in reading levels.

SUMMARY OF THE INVENTION

The invention provides a flash memory storage apparatus and a reading method thereof to lower the influence of the back-pattern effect on a read operation.

A flash memory storage apparatus provided in the invention includes a memory cell array and a memory control circuit. The memory cell array includes at least one memory cell string coupled between a bit line and a source line. The memory control circuit is coupled to the memory cell array. The memory control circuit is configured to control a read operation of the memory cell array during a reading period. The reading period includes a pre-charge period and a discharge period. The source line performs a pre-charge operation on the bit line via a signal transmission path during the pre-charge period. The bit line performs a discharge operation on the source line via the same signal transmission path during the discharge period. The memory cell array includes the at least one memory cell string.

A reading method of a flash memory storage apparatus provided in the invention includes: controlling a source line to perform a pre-charge operation on a bit line via a signal transmission path during a pre-charge period, and controlling the bit line to perform a discharge operation on the source line via the same signal transmission path during a discharge period. The signal transmission path includes memory cell strings.

Based on the above, in an exemplary embodiment of the invention, the bit line and the source line respectively perform the charge and discharge operations via the same signal transmission path, so as to lower the influence of the back-pattern effect on the read operation of the flash memory storage apparatus.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
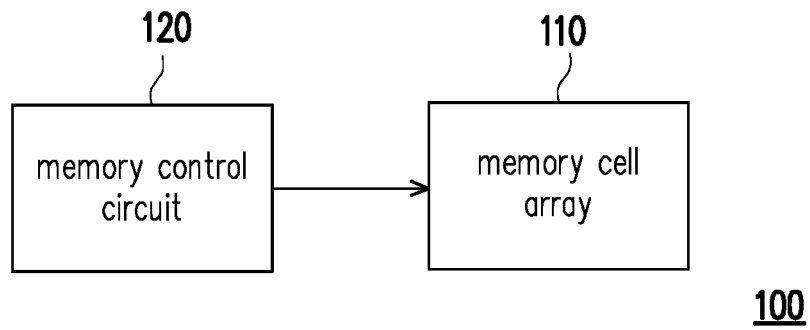
FIG. 1 is a schematic diagram illustrating a flash memory storage apparatus according to an embodiment of the invention.
Figure 2:
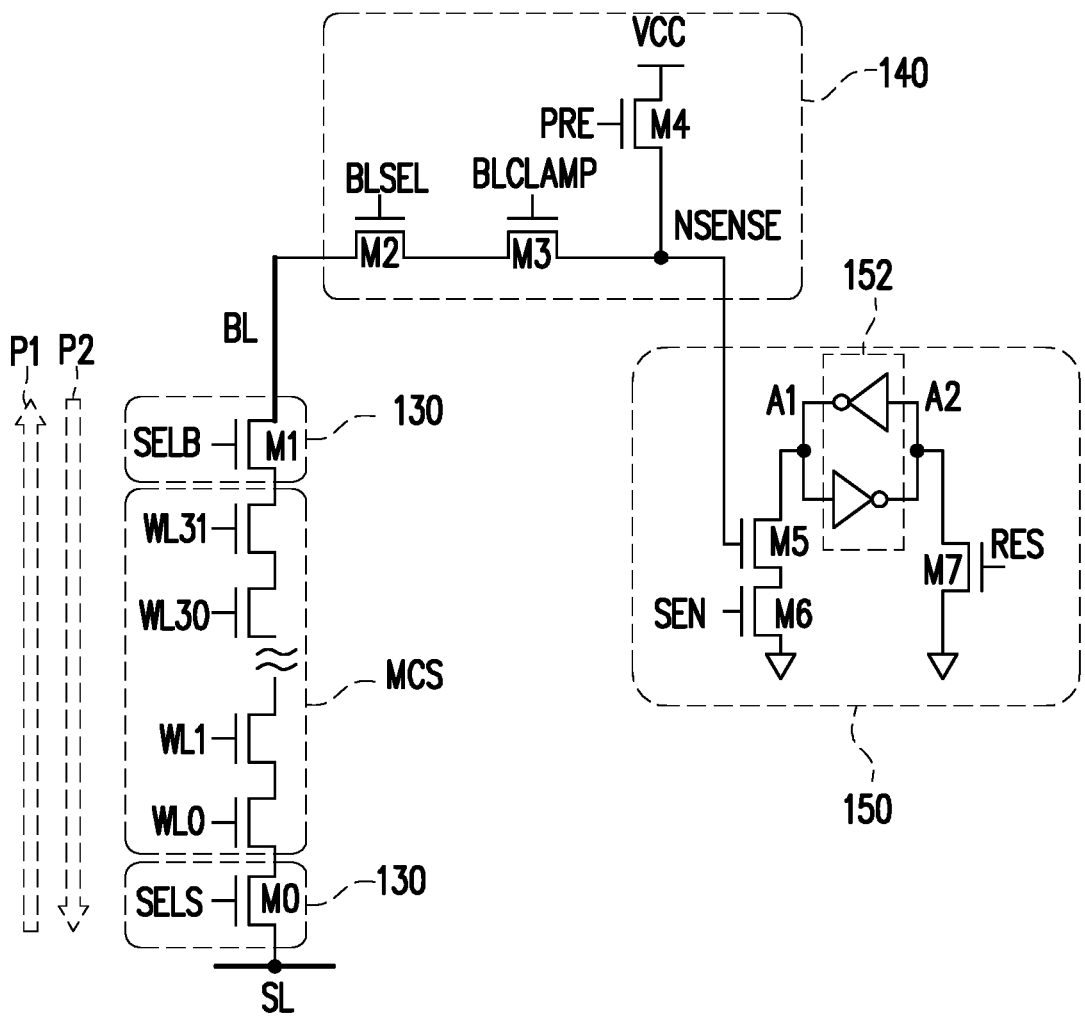
FIG. 2 is a schematic circuit diagram illustrating an internal part of the flash memory storage apparatus in FIG. 1 according to an embodiment of the invention.

Please refer to FIG. 1 and FIG. 2, wherein FIG. 1 is a schematic diagram illustrating a flash memory storage apparatus according to an embodiment of the invention. FIG. 2 is a schematic circuit diagram illustrating an internal part of the flash memory storage apparatus in FIG. 1 according to an embodiment of the invention. In the present embodiment, a flash memory storage apparatus 100 includes a memory cell array 110 and a memory control circuit 120. The memory cell array 110 includes at least one memory cell string MCS as shown in FIG. 2, and the memory cell string MCS is coupled between a bit line BL and a source line SL. The memory control circuit 120 is coupled to the memory cell array 110. The memory control circuit 120 is configured to control a read operation of the memory cell array 110 during a reading period.

Figure 3:
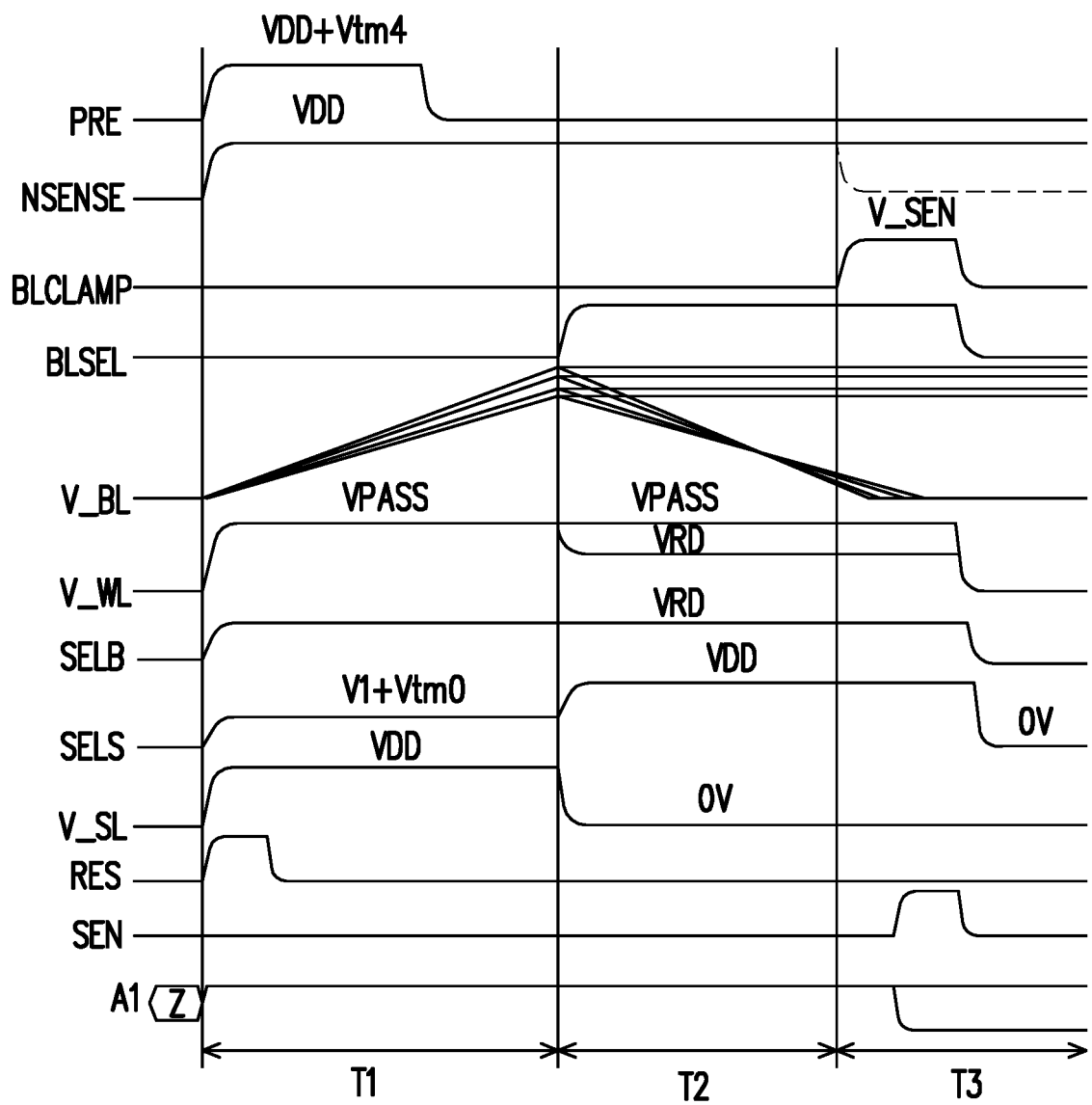
FIG. 3 is a signal waveform diagram illustrating a read operation of a flash memory storage apparatus according to an embodiment of the invention.

FIG. 3 is a signal waveform diagram illustrating a read operation of a flash memory storage apparatus according to an embodiment of the invention. Please refer to FIG. 1 to FIG. 3. In the present embodiment, a selection circuit 130 is configured to select to read the memory cell string MCS during a reading period. In the present embodiment, the selection circuit 130 includes a transistor M0 and a transistor M1. The transistor M0 has a first terminal, a second terminal, and a control terminal. The first terminal of the transistor M0 is coupled to the source line SL. The second terminal of the transistor M0 is coupled to a terminal of the memory cell string MCS. The control terminal of the transistor M0 is coupled to the memory control circuit 120 to receive the selection signal SELS. The transistor M1 has a first terminal, a second terminal, and a control terminal. The first terminal of the transistor M1 is coupled to the other terminal of the memory cell string MCS. The second terminal of the transistor M1 is coupled to the bit line BL. The control terminal of the transistor M1 is coupled to the memory control circuit 120 to receive a selection signal SELB.

In the present embodiment, a bias circuit 140 is configured to provide a bias voltage configured to sense a voltage level V_BL of the bit line BL during the reading period. The bias circuit 140 includes a transistor M2, a transistor M3, and a transistor M4. The transistor M2 has a first terminal, a second terminal, and a control terminal. The first terminal of the transistor M2 is coupled to the bit line BL. The control terminal of the transistor M2 is coupled to the memory control circuit 120 to receive a bit line selection signal BLSEL. The transistor M3 has a first terminal, a second terminal, and a control terminal. The first terminal of the transistor M3 is coupled to the second terminal of the transistor M2. The second terminal of the transistor M3 is coupled to a sensor node NSENSE. The control terminal of the transistor M3 is coupled to the memory control circuit 120 to receive a bit line clamp signal BLCLAMP. The transistor M4 has a first terminal, a second terminal, and a control terminal. The first terminal of the transistor M4 is coupled to the sensor node NSENSE. The second terminal of the transistor M4 is coupled to a system power source VCC. The control terminal of the transistor M4 is coupled to the memory control circuit 120 to receive a pre-charge signal PRE.

In the present embodiment, a sensing circuit 150 is coupled to the sensor node NSENSE and is configured to sense the voltage level V_BL of the bit line BL according to a bias provided by the bias circuit 140 during the reading period and output sensing results. The sensing circuit 150 includes a latch circuit 152, a transistor M5, a transistor M6, and a transistor M7. The latch circuit 152 has an output node A1 and a node A2 that are configured to latch a sensing result of the output node A1, so as to keep a logic level of the sensing result. The transistor M5, the transistor M6, and the transistor M7 respectively have a first terminal, a second terminal, and a control terminal. The first terminal of the transistor M5 is coupled to the second terminal of the transistor M6. The second terminal of the transistor M5 is coupled to the output node A1 of the latch circuit 152. The control terminal of the transistor M5 is coupled to the sensor node NSENSE. The first terminal of the transistor M6 is coupled to a ground voltage. The second terminal of the transistor M6 is coupled to the first terminal of the transistor M5. The control terminal of the transistor M6 is coupled to the memory control circuit 120 to receive a sensing control signal SEN. The first terminal of transistor M7 is coupled to a ground voltage. The second terminal of the transistor M7 is coupled to the node A2 of the latch circuit 152. The control terminal of the transistor M7 is coupled to the memory control circuit 120 to receive a reset signal RES. In other embodiments, the latch circuit 152 may be a bistable circuit or a flip-flop, so the latch circuit of the invention is not limited to the latch circuit 152 described in the present embodiment.

In one embodiment, the selection circuit 130, the bias circuit 140. And the sensing circuit 150 can be configured inside the memory cell array 110, inside the memory control circuit 120, or outside the memory cell array 110 and the memory control circuit 120, wherein the placement locations of the selection circuit 130, the bias circuit 140, and the sensing circuit 150 are not limited in the invention.

In the present embodiment, the memory cell string MCS is coupled between the transistor M0 and the transistor M1. The memory cell string MCS has, for example, 32 memory cells serially-connected with one another, and the control terminals of all memory cells are respectively coupled to corresponding word lines WL0 to WL31. The number of memory cells need not be limited in the invention.

Please refer to FIG. 2 and FIG. 3. In the present embodiment, a reading period includes a pre-charge period T1 and a discharge period T2. The source line SL performs a pre-charge operation on the bit line BL via a signal transmission path P1 during the pre-charge period, while the source line SL performs a discharge operation on the bit line BL via the same signal transmission path P2 during the discharge period T2. The signal transmission paths P1 and P2 include the memory cell string MCS. It should be noted that the signal transmission paths P1 and P2 include the memory cell string MCS in the present embodiment. Specifically, during the pre-charge period T1, the memory control circuit 120 controls the source line SL via the signal transmission path P1 that includes the memory cell string MCS and performs the pre-charge operation on the bit line BL coupled to the memory cell string MCS. In addition, during the discharge period T2, the memory control circuit 120 controls the bit line BL via the signal transmission path P2 that includes the memory cell string MCS and performs the discharge operation on the source line SL of the memory cell string MCS.

In the present embodiment, the control terminal of the transistor M4 of the bias circuit 140 receives a high-level pre-charge signal PRE via a pre-charge operation during the pre-charge period T1, so that the system power source charges the sensor node NSENSE; thereby, the sensor node NSENSE has a voltage level equal to that of a system voltage VDD. In the present embodiment, the voltage level of the pre-charge signal PRE is VDD+Vtm4, for example, wherein Vtm4 is a critical voltage of the transistor M4. As such, after ensuring that the transistor M4 is turned on, the sensor node NSENSE can reach a voltage level equal to that of the system voltage VDD. After the sensor node NSENSE has reached the voltage level equal to that of the system voltage VDD, the pre-charge signal PRE can be switched from a high voltage to a low voltage during the pre-charge period T1. That is to say, the charge operation of the system voltage VDD to the sensor node NSENSE can be started and ended during the pre-charge period T1, which allows the sensor node NSENSE to maintain a voltage level equivalent to that of the system voltage VDD.

The control terminal of the transistor M5 of the sensing circuit 150 receives the system voltage VDD of the sensor node NSENSE via the pre-charge operation during the pre-charge period T1, the control terminal of the transistor M6 receives the low-level sensing control signal SEN, and the transistor M7 receives the high-level reset signal RES, so as to reset the output level of the output node A1 of the sensing circuit 150. In the present embodiment, the logic level of the output node A1 after resetting is "1", and the level of the output node A1 is latched in the latch circuit 152. In other embodiments, the logic level of the output level after resetting can be "0". The reset signal RES may be switched to a low level after completing the resetting of the level of the output node A1 of the sensing circuit 150, so as to complete the reset operation of the output level. That is to say, the level switch of the reset signal RES can be performed during the pre-charge period T1.

In addition, in the present embodiment, the source line SL coupled to the high-level pre-charge voltage, the memory cell string MCS, the transistor M0, and the transistor M1 are turned on during the pre-charge period T1, while the transistor M2 and the transistor M3 are turned off, so the source line SL can perform the pre-charge operation on the bit line BL via the signal transmission path P1.

Specifically, in the present embodiment, an enabling voltage VPASS is applied to the voltage level V_WL of each of the word lines WL0 to WL31 of the memory cells in the selected memory cell string MCS via the pre-charge operation performed during the pre-charge period T1, wherein the source line SL is coupled to the system voltage VDD to increase the voltage level V_SL of the source line SL, the control terminal of the transistor M0 is coupled to the selection signal SELS, and the control terminal of the transistor M1 is coupled to the high-level selection signal SELB, so that the transistor M0 and the transistor M1 are turned on. In addition, the control terminals of the transistor M2 and the transistor M3 are respectively coupled to the low-level bit line selection signal BLSEL and the bit line clamp signal BLCLAMP, so as to turn off the transistor M2 and the transistor M3, thereby enabling the system voltage VDD to perform the pre-charge operation on the bit line BL through the source line SL and the signal transmission path P1 that includes the transistor M0, the memory cell string MCS, and the transistor M1. In the present embodiment, the voltage level V_BL of the bit line BL is increased through performing the pre-charge operation during the pre-charge period T1.

It should be noted that the selection signal SELS received by the control terminal of the transistor M0 may be lower than the voltage level of the system voltage VDD, so as to limit the level of the selected bit line BL during the pre-charge period. For example, when the voltage level of the selection signal SELS is set as V1+Vtm0, and Vtm0 is the critical voltage of the transistor M0, the highest level of the bit line BL during the pre-charge operation period is V1.

It should be noted that, in the embodiment illustrated in FIG. 2 and FIG. 3, the stored information in the memory control string MCS influences the equivalent resistance value of the memory control string MCS; hence, during the pre-charge period T1, the bit line BL has different pre-charge slopes based on the stored information in the memory control string MCS, and the bit line BL is pre-charged to different pre-charge levels by different charge slopes during the pre-charge period T1.

Furthermore, the serially-connected memory cells in the memory cell string MCS are in an erased state or a programmed state according to the result of the stored information. In the memory cell string MCS, the greater the number of the memory cells in the erased state is, the smaller the equivalent resistance value of the memory cell string MCS is, and the greater the charge slope is; the greater the number of the memory cells in the programmed state is, the greater the equivalent resistance value of the memory cell string MCS is, and the smaller the charge slope is. Therefore, when the pre-charge period T1 ends, the corresponding bit line BL of the memory cell string MCS having more memory cells in the erased state has a higher voltage level V_BL, and the corresponding bit line BL of the memory cell string MCS having more memory cells in the programmed state has a lower voltage level V_BL. When the pre-charge period T1 ends, the corresponding bit line BL of the memory cell string MCS in which all the memory cells are in the erased state has the highest voltage level limited by the voltage level of the selection signal SELS.

It is worth mentioning that when the pre-charge period T1 ends, the difference of the voltage level V_BL of the bit line BL is determined according to the stored information in the memory control string MCS. That is to say, during the pre-charge period T1, when the source line SL performs pre-charging on the bit line BL of the memory cell string MCS through the signal transmission path P1 that includes the memory cell string MCS, the back-pattern bias of the stored information in the memory cell string MCS is reflected to the voltage level V-BL of the bit line BL. That is to say, through the pre-charge operation, the flash memory storage apparatus 100 can compensate the voltage level V_BL of the corresponding bit line BL based on the back-pattern effect.

Please again refer to the embodiment illustrated in FIG. 2 and FIG. 3. In the discharge period T2, the source line SL is coupled to the ground voltage GND, the memory cells, the transistor M0, the transistor M1, and the transistor M2 are turned on, while the transistor M3 is turned off, so that the bit line BL performs a discharge operation on the source line SL via the same signal transmission line P2.

Specifically, the source line SL is coupled to the ground voltage GND during the discharge period T2. The control terminal of the transistor M0 is coupled to the selection signal SELS that has the level of the system voltage VDD, the control terminal of the transistor M1 is continuously coupled to the high-level selection signal SELB, and the control terminal of the transistor M2 is coupled to the high-level bit line selection signal BLSEL, so that the transistor M0 and the transistor M1 of the selection circuit and the transistor M2 of the bias circuit are turned on. The transistor M4 remains in the turned-off state after completely charging the sensor node NSENSE during the pre-charge period, and the transistor M3 of the bias circuit 140 also remains in the turned-off state, so that the voltage level V_BL of the bit line BL performs a discharge operation via the signal transmission path P2 that includes the transistor M1, the memory cell string MCS, and the transistor M0.

It should be noted that the memory cells include one single target memory cell that is read and a plurality of non-target memory cells. The word lines of the non-target memory cells are applied with the enabling voltage VPASS during the discharge period T2, and the word line of the remaining target memory cell is applied with the enabling voltage VRD. The voltage level V_WL of the enabling voltage VPASS is greater than the voltage level V_WL of the enabling voltage VRD. Therefore, the way to conduct the memory cell string MCS during the discharge operation is different from the operation of providing the enabling voltage VPASS to the word lines WL0-WL31 of the memory cells during the pre-charge operation.

In the embodiment depicted in FIG. 2 and FIG. 3, note that the stored information in the memory cell string MCS influences the results of the equivalent resistance value of the memory cell string MCS. Therefore, during the discharge period T2, the bit line BL has the absolute value of different linear discharge slopes according to the stored information of the corresponding memory cell string MCS and performs the discharge operation.

Furthermore, the memory cell string MCS includes not only the read target memory cell and the non-target memory cell. In the memory cell string MCS, the greater the number of the memory cells in the erased state is, the smaller the equivalent resistance value of the memory cell string MCS is, and the greater the absolute value of the discharge slope is. That is to say, the greater the number of the memory cells in the erased state in the memory cell string MCS is, the faster the discharge speed is. On the contrary, in the memory cell string MCS, the greater the number of the memory cells in the programmed state is, the greater the equivalent resistance value of the memory cell string MCS is, and the smaller the absolute value of the discharge slope is. That is to say, the greater the number of the memory cells in the programmed state in the memory cell string MCS is, the slower the discharge speed is.

Figure 4:
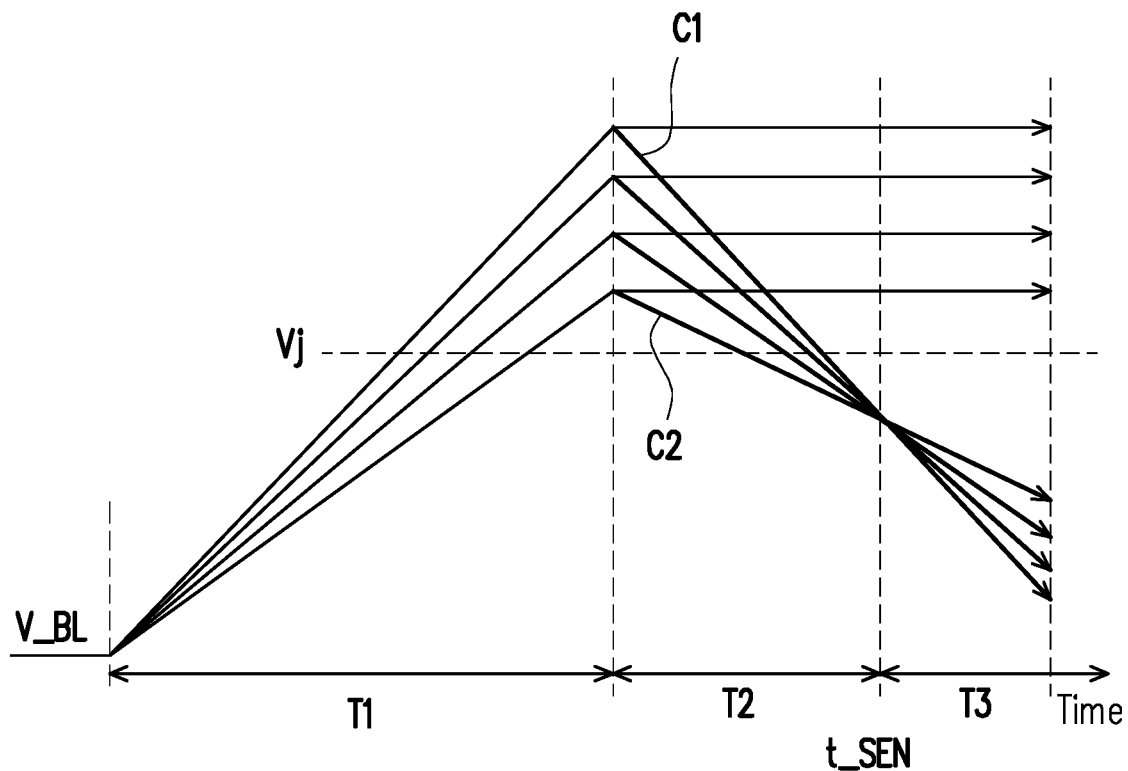
FIG. 4 is a schematic diagram illustrating voltage level changes on a bit line in a charge period and a discharge period according to an embodiment of the invention.

Please refer to FIG. 3 and FIG. 4, wherein FIG. 4 is a schematic diagram illustrating voltage level changes on a bit line in the charge period T1 and the discharge period T2 according to an embodiment of the invention. When the stored information in the target memory cell is in the erased state, the waveform C1 of the bit line BL corresponding to the memory cell string with more non-target memory cells in the erased state has a larger charge slope during the pre-charge period T1, so that a higher voltage level V_BL is reached after the pre-charge period T1 ends. Next, when entering the discharge period T2, the voltage level V_BL of the waveform C2 of the same bit line BL has a faster discharge speed during the discharge period T2. On the contrary, the waveform C2 of the bit line BL corresponding to the memory cell string with more non-target memory cells in the programmed state has a smaller charge slope during the pre-charge period T1, so that a lower voltage level V_BL is reached after the pre-charge period T1 ends. After that, when entering the discharge period T2, the voltage level V_BL of the waveform C2 of the bit line BL has a slower discharge speed during the discharge period T2. Hence, since the discharge operation starts, and when the stored information in the target memory cell string is in the erased state, the variation trend of and the level variation in the bit lines BL that correspond to the memory cell strings in the memory cell array and have undergone the back-pattern effect compensation gradually converge in the discharge period T2. As such, when the voltage level V_BL is lower than the predetermined judge level Vj, the level variation is smaller, and the sensing window is greater, so as to improve the accuracy of the read operation.

After the discharge operation, the time point at which the voltage levels V_BL of the bit lines BL are lower than the predetermined judge level Vj and the variation of the voltage level V_BL of the bit lines BL reaches the greatest convergence result, is the best sensing time t_SEN. At or after the best sensing time t_SEN, the control terminal of the transistor M3 may be coupled to the bit line clamp signal BLCLAMP that has the sensing voltage level V_SEN, the transistor M2 is continuously turned on, and the transistor M4 is continuously turned off, so as to begin to enter the sensing period T3 and start to generate and output sensing results. Besides, the transistor M0 and the transistor M1 of the selection circuit are continuously turned on, and the enabling voltage VRD and the enabling voltage VPASS are continuously and respectively applied to the read target memory cell of the memory cell string MCS and the word lines of the non-target memory cells.

Please again refer to FIG. 2 and FIG. 3. In the present embodiment, the sensing voltage level V_SEN is lower than the system voltage VDD and is configured to be a criterion for the sensor node NSENSE to determine whether to perform the discharge operation or not based on the level of the bit line BL. For example, the sensing voltage level V_SEN is set as 0.9V, and the level of the bit line BL remains greater than 1V when the sensing period T3 starts, indicating that the read target memory cell is in the programmed state, and the corresponding bit line BL is not discharged. Hence, given that the level of the bit line BL is greater than the sensing voltage level V_SEN, the bit clamp signal BLCLAMP is not enough to turn on the transistor M3, and the sensor node NSENSE at the level of the system voltage VDD cannot be discharged through the transistor M3 to maintain the level of the system voltage VDD. On the contrary, when the level of the bit line BL approaches 0V (e.g., 0.2 to 0.3V) as the sensing period T3 is starting, it indicates that the read target memory cell is in the erased state, and the corresponding bit line performs the discharge operation. Therefore, given that the level of the bit line BL is smaller than the sensing voltage V_SEN, the bit clamp signal BLCLAMP can turn on the transistor M3, and the sensor node NSENSE at the level of the system voltage VDD can be discharged through the transistor M3 to a low voltage level.

After that, the memory control circuit provides the sensing circuit 150 with the high-level sensing control signal SEN. In the present embodiment, when the sensor node NSENSE and the sensing control signal SEN are both at high levels, i.e., the read target memory cell is in the programmed state, the reset high output level that is latched in the latch circuit 152 is discharged to a low level, and a low-level sensing result is output from the output node A1. When the sensor node NSENSE is at a low level, i.e., the read target memory cell is in the erased state, the reset high output level that is latched in the latch circuit 152 is not discharged and remains at a high level, and a high-level sensing result is output from the output node A1. That is to say, in the sensing circuit 150 of the invention, the sensing result corresponding to the memory state of the target memory cell may be output during the sensing period T3 through the coupling to the sensor node NSENSE and the control of the memory control circuit.

Figure 5:
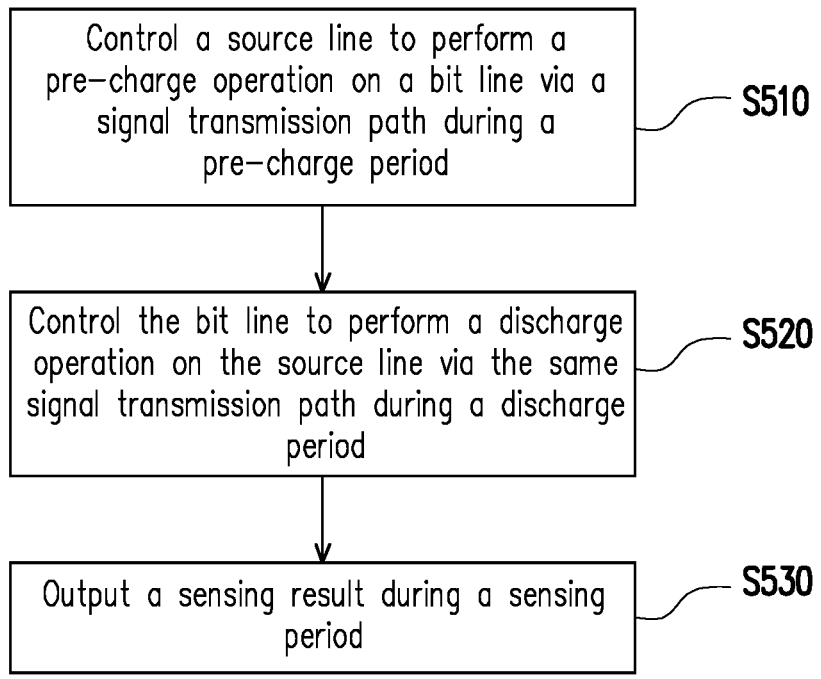
FIG. 5 is a flow chart illustrating a reading method of a flash memory storage apparatus according to an embodiment of the invention.

Please refer to FIG. 2 and FIG. 5. FIG. 5 is a flow chart illustrating a reading method of the flash memory storage apparatus according to an embodiment of the invention. The reading method provided in the present embodiment can at least be applied to the flash memory storage apparatus illustrated in FIG. 1 to FIG. 4, but the invention is not limited thereto. In the present embodiment, in step S510, the control memory circuit 120 controls the source line SL to perform the pre-charge operation on the bit line BL via the signal transmission path P1 during the pre-charge period T1. In step S520, the control memory circuit 120 controls the bit line BL to perform the discharge operation on the source line SL via the same signal transmission path P2 during the discharge period T2. In step 530, the sensing circuit 150 outputs the sensing result during the sensing period T3. In addition, the reading method of the flash memory storage apparatus provided in the present embodiment of the invention may be derived from the teachings, suggestions, and implementations provided in the embodiments shown in FIG. 1 to FIG. 4.

Figure 6:
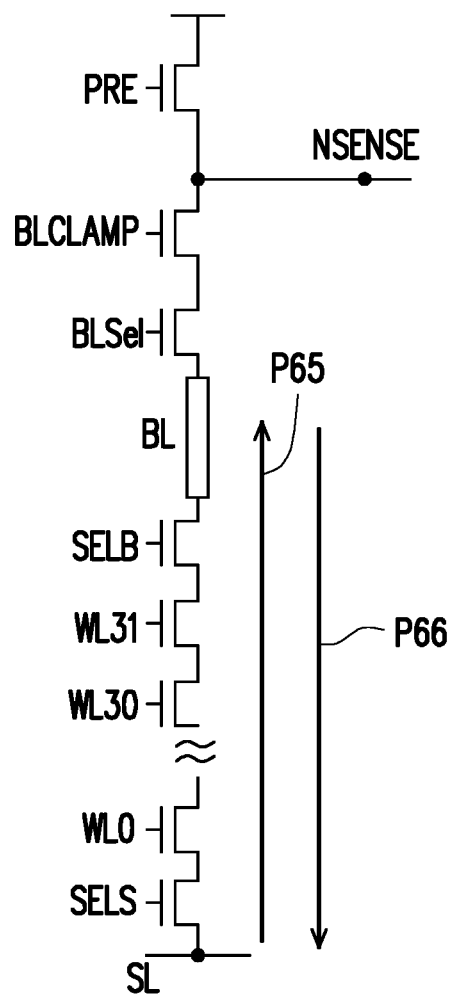
FIG. 6 is a schematic diagram illustrating a read operation of a flash memory storage apparatus according to an embodiment of the invention.

Please refer to FIG. 6. FIG. 6 is a schematic diagram illustrating a read operation of a flash memory storage apparatus according to an embodiment of the invention. In FIG. 6, the read operation includes a charge operation and a discharge operation of a bit line. The pre-charge operation means that the source line SL performs a pre-charge operation on the bit line BL via a signal transmission path P65, and the discharge operation means that the bit line BL performs a discharge operation via a signal transmission path P66, wherein the signal transmission path P65 and the signal transmission path P66 are the same and include the memory cell string but in opposite directions. Accordingly, the bit line BL is pre-charged to a different voltage level at a different charging speed. After that, during the discharge period, the bit line BL performs a discharge operation on the source line SL via the same signal transmission path, so as to lower the possibility of misreading the level caused by the back-pattern effect in the flash memory storage apparatus.

To sum up, an embodiment of the invention provides a flash memory storage apparatus and a reading method thereof. In the read operation, the source line performs the pre-charge operation on the bit line via the signal transmission path during the pre-charge period, and the bit line is pre-charged to a different voltage level at a different charging speed according to the difference in the stored information in the memory cell string. The bit line then performs the discharge operation on the source line via the same signal transmission path during the discharge period. Since the discharge speed is changed according to the difference in the stored information in the memory cell string, the bit lines corresponding to the memory cell strings with different stored information have been compensated for the back-pattern effect, thereby reducing the possibility of misreading the level caused by the back-pattern effect in the flash memory storage apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory storage apparatus, comprising:
a memory cell array, comprising at least one memory cell string, coupled between a bit line and a source line, the at least one memory cell string comprises a plurality of serially-coupled memory cells; and
a memory control circuit, coupled to the memory cell array and configured to control a read operation of the memory cell array during a reading period, the reading period comprising a pre-charge period and a discharge period,
wherein the source line performs a pre-charge operation to provide a pre-charge current from the source line to the bit line via a signal transmission path during the pre-charge period, the plurality of memory cells are provided with a same enabling voltage during the pre-charge operation,
wherein the bit line performs a discharge operation to provide a discharge current from the bit line to the source line via the same signal transmission path during the discharge period, and the signal transmission path comprises the at least one memory cell string.

2. The flash memory storage apparatus as claimed in claim 1, wherein the source line is coupled to a pre-charge voltage during the pre-charge period, the source line is coupled to a ground voltage during the discharge period, and the pre-charge voltage is greater than the ground voltage.

3. The flash memory storage apparatus as claimed in claim 1, wherein during the pre-charge period the bit line is pre-charged to a different voltage level at a different charge slope based on information stored in the at least one memory cell string.

4. The flash memory storage apparatus as claimed in claim 3, wherein the plurality of serially-coupled memory cells are in a first state or a second state, the more the number of memory cells in the first state is, the greater the charge slope is, and the more the number of memory cells in the second state is, the smaller the charge slope is.

5. The flash memory storage apparatus as claimed in claim 1, wherein during the discharge period the bit line discharges at a different charge slope based on information stored in the at least one memory cell string.

6. The flash memory storage apparatus as claimed in claim 5, wherein the plurality of serially-coupled memory cells are in a first state or a second state, the more the number of memory cells in the first state is, the greater an absolute value of the charge slope is, and the more the number of memory cells in the second state is, the smaller the absolute value of the charge slope is.

7. The flash memory storage apparatus as claimed in claim 1, wherein control terminals of the memory cells are separately coupled to corresponding word lines, and during the pre-charge period, the word lines of the memory cells are being applied with a first enabling voltage.

8. The flash memory storage apparatus as claimed in claim 7, wherein the memory cells comprise a target memory cell and a plurality of non-target memory cells, during the discharge period, the word lines of the non-target memory cells are applied with the first enabling voltage, the word line of the target memory cell is applied with a second enabling voltage, and the first enabling voltage is greater than the second enabling voltage.

9. The flash memory storage apparatus as claimed in claim 1, further comprising a selection circuit, the selection circuit comprising:
a first transistor having a first terminal, a second terminal, and a control terminal, wherein the first terminal of the first transistor is coupled to the source line, the second terminal of the first transistor is coupled to one terminal of the at least one memory cell string, and the control terminal of the first transistor is coupled to a first selection signal; and
a second transistor having a first terminal, a second terminal, and a control terminal, wherein the first terminal of the second transistor is coupled to the other terminal of the at least one memory cell string, the second terminal of the second transistor is coupled to the bit line, and the control terminal of the second transistor is coupled to a second selection signal,
wherein during the pre-charge and discharge periods, the first and second transistors are turned on.

10. The flash memory storage apparatus as claimed in claim 9, further comprising a bias circuit, the bias circuit comprising:
a third transistor having a first terminal, a second terminal, and a control terminal, wherein the first terminal of the third transistor is coupled to the bit line, and the control terminal of the third transistor is coupled to a bit line selection signal;

a fourth transistor having a first terminal, a second terminal, and a control terminal, wherein the first terminal of the fourth transistor is coupled to the second terminal of the third transistor, the second terminal of the fourth transistor is coupled to a sensor node, and the control terminal of the fourth transistor is coupled to a bit line clamp signal; and a fifth transistor having a first terminal, a second terminal, and a control terminal, wherein the first terminal of the fifth transistor is coupled to the sensor node, the second terminal of the fifth transistor is coupled to a system voltage, and the control terminal of the fifth transistor is coupled to a pre-charge signal, wherein during the pre-charge and discharge periods, the third transistor is turned off.

11. The flash memory storage apparatus as claimed in claim 10, further comprising a sensing circuit coupled to the sensor node and configured to output a sensing result during a sensing period, wherein the reading period comprises the sensing period.

12. A reading method of a flash memory storage apparatus, wherein the flash memory storage apparatus comprises a memory cell array, and the memory cell array comprises at least one memory cell string coupled between a bit line and a source line, wherein the at least one memory cell string comprises a plurality of serially-coupled memory cells in a first state or a second state, the reading method comprising:

controlling the source line to perform a pre-charge operation to provide a pre-charge current from the source line to the bit line via a signal transmission path during a pre-charge period, voltage of the bit line is pre-charged to a voltage level corresponds to number of the memory cells in the first state, wherein the signal transmission path comprises the at least one memory cell string; and controlling the bit line to perform a discharge operation to provide a discharge current from the bit line to the source line via the same signal transmission path during a discharge period.

13. The reading method of the flash memory storage apparatus as claimed in claim 12, wherein the step for controlling the source line to perform the pre-charge operation on the bit line via the signal transmission path during the pre-charge period comprises:

providing a pre-charge voltage to the bit line during the pre-charge period, wherein a charge slope of the pre-charge voltage is decided based on information stored in the at least one memory cell string, so as to pre-charge the bit line to a different voltage level.

14. The reading method of the flash memory storage apparatus as claimed in claim 13, wherein the plurality of serially-coupled memory cells are in a first state or a second state, the more the number of memory cells in the first state is, the greater the charge slope is, and the more the number of memory cells in the second state is, the smaller the charge slope is.

15. The reading method of the flash memory storage apparatus as claimed in claim 13, wherein the step for controlling the bit line to perform the discharge operation on the source line via the same signal transmission path during the discharge period comprises:

discharging the bit line at a different discharge slope based on information stored in the at least one memory cell string, wherein during the discharge period, the source line is coupled to a ground voltage.

16. The reading method of the flash memory storage apparatus as claimed in claim 15, wherein the plurality of serially-coupled memory cells are in a first state or a second state, the more the number of memory cells in the first state is, the greater an absolute value of the charge slope is, and the more the number of memory cells in the second state is, the smaller the absolute value of the charge slope is.

17. The reading method of the flash memory storage apparatus as claimed in claim 15, wherein the pre-charge voltage is greater than the ground voltage.

18. The reading method of flash memory storage apparatus as claimed in claim 12, wherein the step for controlling the source line to perform the pre-charge operation on the bit line during the pre-charge period via the signal transmission path comprises:

applying a first enabling voltage to word lines of the memory cells.

19. The reading method of the flash memory storage apparatus as claimed in claim 18, wherein the memory cells comprise a target memory cell and a plurality of non-target memory cells, and the step for controlling the bit line to perform the discharge operation on the source line during the discharge period via the same signal transmission path comprises:

applying the first enabling voltage to the word lines of the non-target memory cells; and applying a second enabling voltage to the word line of the target memory cell, wherein the first enabling voltage is greater than the second enabling voltage.

20. The reading method of the flash memory storage apparatus as claimed in claim 12, further comprising outputting a sensing result during a sensing period.

* * * * *